United States Patent
Kim

(10) Patent No.: US 7,858,489 B2
(45) Date of Patent: Dec. 28, 2010

(54) METHOD FOR MANUFACTURING SEMICONDUCTOR DEVICE CAPABLE OF INCREASING CURRENT DRIVABILITY OF PMOS TRANSISTOR

(75) Inventor: Jun Ki Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 43 days.

(21) Appl. No.: 12/118,264

(22) Filed: May 9, 2008

(65) Prior Publication Data

US 2009/0111238 A1 Apr. 30, 2009

(30) Foreign Application Priority Data

Oct. 26, 2007 (KR) .................. 10-2007-0108428

(51) Int. Cl.
*H01L 21/76* (2006.01)

(52) U.S. Cl. .............. 438/425; 438/221; 438/222; 438/424; 257/E21.546; 257/E21.55

(58) Field of Classification Search .......... 438/207, 438/296, 221, 421, 430, 431, 432, 199, 222, 438/425, 424; 257/E21.546, E21.55
See application file for complete search history.

(56) References Cited

U.S. PATENT DOCUMENTS

| | | | | |
|---|---|---|---|---|
| 6,251,735 B1* | 6/2001 | Lou | | 438/296 |
| 6,326,282 B1* | 12/2001 | Park et al. | | 438/424 |
| 7,208,812 B2* | 4/2007 | Ohta | | 257/510 |
| 2005/0040460 A1* | 2/2005 | Chidambarrao et al. | | 257/336 |
| 2007/0164325 A1* | 7/2007 | Liao et al. | | 257/278 |
| 2008/0150037 A1* | 6/2008 | Teo et al. | | 257/374 |
| 2008/0173930 A1* | 7/2008 | Watanabe et al. | | 257/321 |

FOREIGN PATENT DOCUMENTS

| | | |
|---|---|---|
| KR | 1020020045656 A | 6/2002 |
| KR | 1020020083807 A | 11/2002 |
| KR | 2006-0128621 A | 12/2006 |
| KR | 2007-0036970 A | 4/2007 |

OTHER PUBLICATIONS

J.W. Lee, et al; "Improvement of Data Retention Time in DRAM using Recessed Channel Array Transistors with Asymmetric Channel doping for 80 nm feature size and beyond", ESSDERC, 2004, pp. 449-452.
Scott E. Thompson, et al; "A 90-nm Logic Technology Featuring Strained-Silicon", IEEE Transactions on Electron Devices, vol. 51, No. 11, Nov. 2004, pp. 1790-1797.
Deok-Hyung Lee, et al; "Fin-Channel-Array Transistor (FCAT) Featuring Sub-70nm Low Power and High Performance DRAM", IEDM Tech. Dig., 2003, pp. 407-410.

* cited by examiner

*Primary Examiner*—Julio J Maldonado
(74) *Attorney, Agent, or Firm*—Ladas & Parry LLP

(57) ABSTRACT

A semiconductor device capable of selectively applying different stresses for increasing current drivability of PMOS transistor is made by defining trenches in a semiconductor substrate having a PMOS region; forming selectively a buffer layer on sidewalls of the trenches; forming an insulation layer to fill the trenches; annealing the semiconductor substrate such that compressive stress is applied in a channel length direction of a PMOS transistor by oxidizing the buffer layer; removing portions of the insulation layer and thereby forming an isolation layer; and forming the PMOS transistor on the PMOS region of the semiconductor substrate.

8 Claims, 10 Drawing Sheets

METHOD FOR MANUFACTURING SEMICONDUCTOR DEVICE CAPABLE OF INCREASING CURRENT DRIVABILITY OF PMOS TRANSISTOR

CROSS-REFERENCE TO RELATED APPLICATIONS

The present application claims priority to Korean patent application number 10-2007-0108428 filed on Oct. 26, 2007, which is incorporated herein by reference in its entirety.

BACKGROUND OF THE INVENTION

The present invention relates to a method for manufacturing a semiconductor device, and more particularly, to a method for manufacturing a semiconductor device, which can increase the current drivability of a PMOS transistor.

As semiconductor devices becomes more highly integrated, the length of the channel of a transistor decreases, and the doping concentrations of a source region and a drain region increase. As the channel length of the transistor decreases and doping concentrations increase, a charge sharing phenomenon between the source area and the drain area increasingly would be more likely to occur, degrading the controllability of the gates. As a result an abrupt decrease in threshold voltage known as a short channel effect occurs. The short channel effect if problematic as it deteriorates the drain-induced barrier lowering (DIBL) characteristic and the current drivability of a transistor, and therefore decreases the operation speed of a semiconductor device. A semiconductor device having the conventional planar channel is limited in overcoming the various problems caused by the high integration of a semiconductor device, such as a short channel effect, the deterioration of an operation speed, and so on.

To solve these problems, efforts were made in the past to find ways to enlarge a channel region, by which a recess gate for increasing the effective channel length and a fin gate for increasing the effective channel width became known.

To increase the current drivability of a transistor, the techniques for decreasing the thickness of a gate insulation layer or the depth of a junction area or a super-steep retrograde (SSR) were studied. Also, in order to increase the current drivability of a transistor, efforts were made to find ways to apply stress to a semiconductor substrate.

The directions of stresses, that must be applied to a semiconductor substrate to increase the current drivability of a transistor, vary depending upon the kind of the transistor. Hereafter, the directions of stresses, which must be applied depending upon the kind of a transistor to increase the current drivability of the transistor, will be described with reference to FIGS. 1A and 1B and Table 1.

TABLE 1

|  | NMOS | PMOS |
| --- | --- | --- |
| X direction | tensile stress | compressive stress |
| Y direction | tensile stress | tensile stress |
| Z direction | compressive stress | tensile stress |

Referring to FIGS. 1A and 1B, a transistor is formed by forming a gate 110 on a semiconductor substrate 100, and forming source and drain regions 120 in the semiconductor substrate 100 on both sides of the gate 110. The channel length direction of the transistor is denoted as the X direction, the channel width direction of the transistor is denoted as the Y direction, and the height direction of the gate 110 is denoted as the Z direction.

Referring to Table 1, the current drivability and an operation speed of an NMOS transistor can be increased when tensile stresses are applied in the X direction and the Y direction and compressive stress is applied in the Z direction. The current drivability and an operation speed of the PMOS transistor can be increased when compressive stress is applied in the X direction and tensile stresses are applied in the Y direction and the Z direction.

For example, the NMOS transistor can be realized by forming a SiGe layer and a Si layer sequentially on a semiconductor substrate made of bulk silicon through epitaxial growth and then forming NMOS gates on the Si layer. In this case, since the Si layer is formed on the SiGe layer, the distance between lattices in the Si layer increases because the SiGe layer has greater distance between lattices then the Si layer. By forming the Si Layer and the SiGe layer sequentially as described above, tensile stresses can be applied in both the channel length direction and the channel width direction of the NMOS transistor, that is, the X direction and the Y direction. Hence, the current drivability and the operation speed of the NMOS transistor can be increased.

In the conventional art, the same kind of stresses, that is, tensile stresses are applied in the channel length direction and the channel width direction of the NMOS transistor. However, in the case of the PMOS transistor in which different kinds of stresses must be applied in the X direction and the Y direction to increase the current drivability, the current drivability cannot be properly increased through the method of applying stresses to the semiconductor substrate in the same manner as the NMOS transistor. In the case of the PMOS transistor, to increase the current drivability compressive stress must be applied in the X direction and tensile stress must be applied in the Y direction, and as such, the method of applying the tensile stresses in both the X direction and the Y direction cannot be used.

SUMMARY OF THE INVENTION

Embodiments of the present invention are directed to a method for manufacturing a semiconductor device that can increase the current drivability of a PMOS transistor.

Also, embodiments of the present invention are directed to a method for manufacturing a semiconductor device that can increase the current drivability of a PMOS transistor, thereby improving the operation characteristics of a semiconductor device.

In one aspect, a method for manufacturing a semiconductor device comprises the step of forming an isolation layer having a structure in which an insulation layer is filled in trenches defined in a semiconductor substrate having a PMOS region; the step of forming the isolation layer comprising forming a buffer layer selectively on sidewalls of the trenches; and oxidizing the buffer layer such that compressive stress is applied in a channel length direction of the PMOS transistor.

The buffer layer is formed as a layer made of any one of Si, Ge, Al, Zr, Hf and B. Preferably, the buffer layer is formed as a Si layer.

The buffer layer is formed as a layer containing at least one of Si, Ge, Al, Zr, Hf and B.

The buffer layer is formed as an oxide layer in which at least one of Si, Ge, Al, Zr, Hf and B is oxidized to an oxygen lacking state.

Oxidation of the buffer layer is conducted at a temperature of 700~1,000° C. under a pressure of 200~760 Torr.

In another aspect, a method for manufacturing a semiconductor device comprises the steps of defining trenches in a semiconductor substrate having a PMOS region; forming a buffer layer selectively on sidewalls of the trenches; forming an insulation layer to fill the trenches having the buffer layer formed on the sidewalls thereof; annealing the semiconductor substrate such that the buffer layer is oxidized and compressive stress is applied in a channel length direction of a PMOS transistor; removing portions of the insulation layer and thereby forming an isolation layer; and forming the PMOS transistor on the PMOS region of the semiconductor substrate.

After the step of defining the trenches and before the step of forming the buffer layer, the method further comprises the steps of forming a sidewall oxide on surfaces of the trenches; and forming a liner nitride layer on the semiconductor substrate including the sidewall oxide.

After the step of forming the liner nitride layer, the method further comprises the step of forming a liner oxide layer on the liner nitride layer.

The buffer layer is formed as a layer made of any one of Si, Ge, Al, Zr, Hf and B. Preferably, the buffer layer is formed as a Si layer.

The buffer layer is formed as a layer containing at least one of Si, Ge, Al, Zr, Hf and B.

The buffer layer is formed as an oxide layer in which at least one of Si, Ge, Al, Zr, Hf and B is oxidized to an oxygen lacking state.

The step of forming selectively the buffer layer on the sidewalls of the trenches comprises the steps of depositing a buffer layer on the semiconductor substrate including the surfaces of the trenches; and etching the buffer layer such that the buffer layer remains only on sidewalls of the trenches.

The insulation layer comprises an oxide layer which is formed through at least one selected from a group consisting of an HDP process and an SOD process.

Annealing is conducted at a temperature of 700~1,000° C. under a pressure of 200~760 Torr.

DESCRIPTION OF SPECIFIC EMBODIMENT

In the present invention, a buffer layer is formed on the sidewalls of trenches defined in the PMOS region of a semiconductor substrate made of bulk silicon. The buffer layer may comprise a silicon layer. An isolation structure is formed by filling the trenches, which have the buffer layer formed on the sidewalls thereof, with an insulation layer. Then, the buffer layer is oxidized. Thereafter, a PMOS transistor including a gate and source and drain regions are formed in the PMOS region of the semiconductor substrate.

As the buffer layer is oxidized, the volume of the buffer layer increases. Due to this increase in the volume of the buffer layer, the silicon lattices in the semiconductor substrate are pushed, or compressed, such that the distance between the silicon lattices decreases. As a result, compressive stress is selectively applied only in the channel length direction in the PMOS region of the semiconductor substrate.

Therefore, in the present invention, different stresses can be applied in the channel length direction and the channel width direction in the PMOS transistor, because a method of selectively applying compressive stress only in the channel length direction is used in addition to the conventional method of applying stress to a semiconductor substrate. By applying different stresses in the channel length direction and the channel width direction in the PMOS transistor, the current drivability of the PMOS transistor can be effectively increased, and the operation characteristics of a semiconductor device can be improved.

Hereafter, a specific embodiment of the present invention will be described in detail with reference to the attached drawings.

Figure 1A:
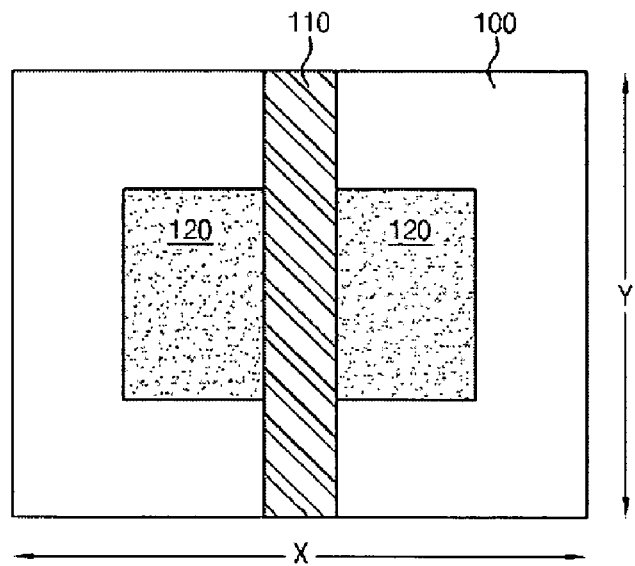
FIG. 1A is a plan view of a conventional transistor.
Figure 1B:
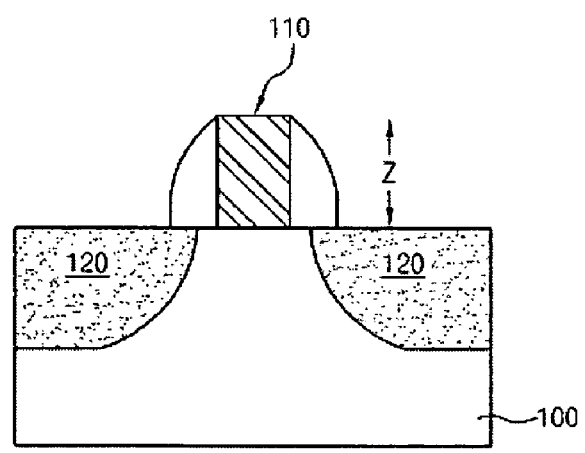
FIG. 1B is a cross-sectional view of a conventional transistor.
Figure 2:
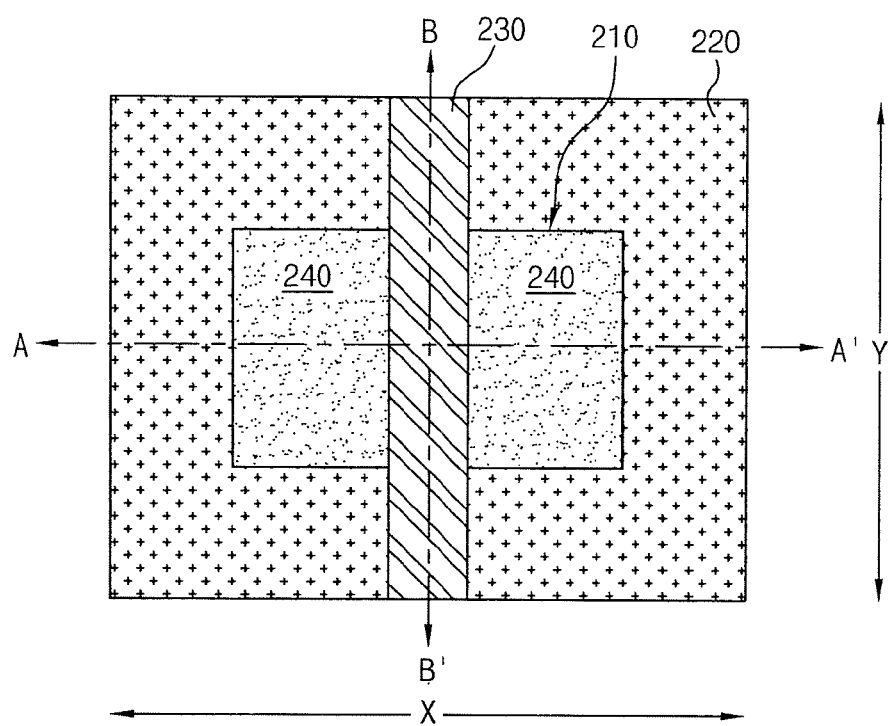
FIG. 2 is a plan view for explaining a method for manufacturing a semiconductor device in accordance with an embodiment of the present invention.

FIG. 2 is a plan view for explaining a method for manufacturing a semiconductor device in accordance with an embodiment of the present invention, and FIGS. 3A through 3H and 4A through 4H are sectional views taken along the respective lines A-A' and B-B' of FIG. 2, illustrating the processes of the method for manufacturing a semiconductor device in accordance with the embodiment of the present invention. FIG. 2 shows an active region 210, an isolation structure 220, a gate 230, and source and drain regions 240. As shown in FIG. 2, the channel length direction of a transistor is denoted as the X direction, and the channel width direction of the transistor is denoted as the Y direction.

Figure 3A:
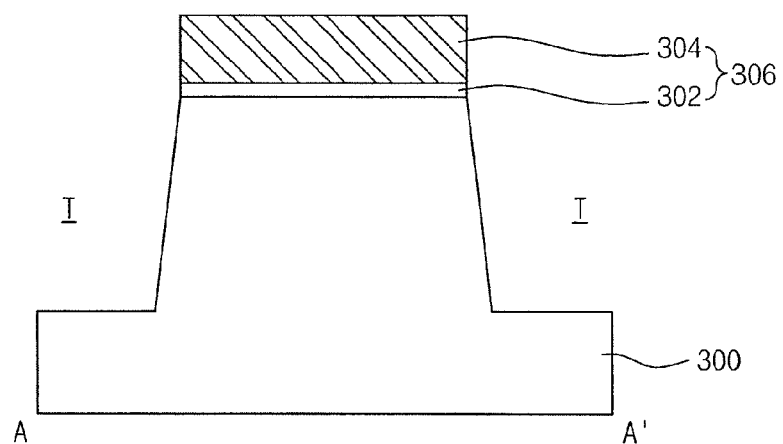
FIGS. 3A through 3H are cross-sectional views taken along the line A-A' of FIG. 2, illustrating the processes of the method for manufacturing a semiconductor device in accordance with an embodiment of the present invention.
Figure 4A:
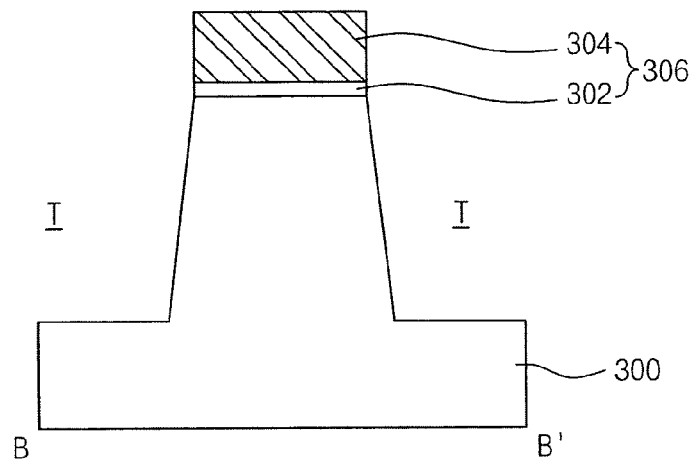
FIGS. 4A through 4H are cross-sectional views taken along the line B-B' of FIG. 2, illustrating the processes of the method for manufacturing a semiconductor device in accordance with an embodiment of the present invention.

Referring to FIGS. 3A and 4A, after forming a pad oxide layer 302 and a pad nitride layer 304 on a semiconductor substrate 300 having a PMOS region, a hard mask 306 is formed by patterning the pad nitride layer 304 and the pad oxide layer 302. Trenches T for forming an isolation structure are defined by etching the semiconductor substrate 300 using the hard mask 306 as an etch mask.

Figure 3B:
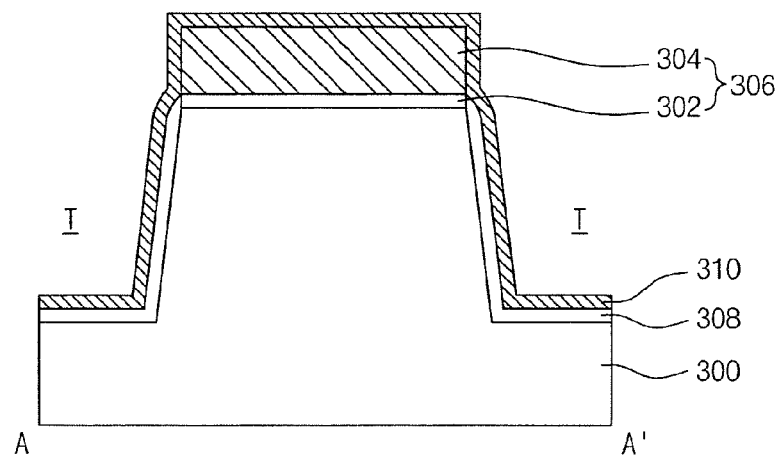
Figure 4B:
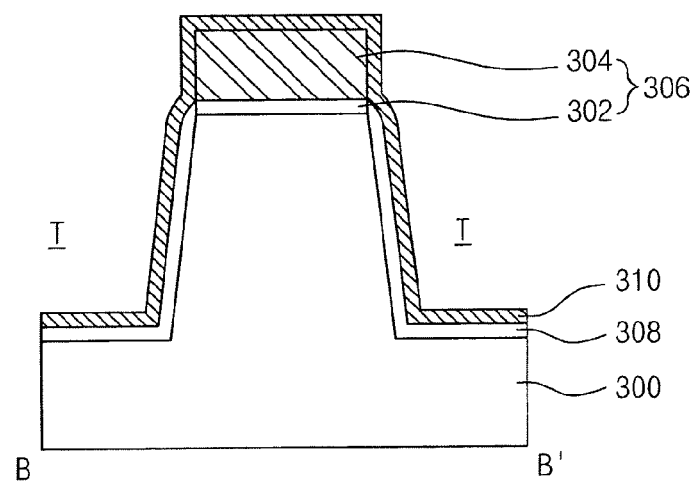

Referring to FIGS. 3B and 4B, a sidewall oxide 308 is formed on the sidewalls of the trenches T through a thermal oxidation process. A liner nitride layer 310 is formed on both the sidewall oxide 308 and the hard mask 306. Thereafter, while not shown in the drawings, a liner oxide layer can be formed on the liner nitride layer 310.

Figure 3C:
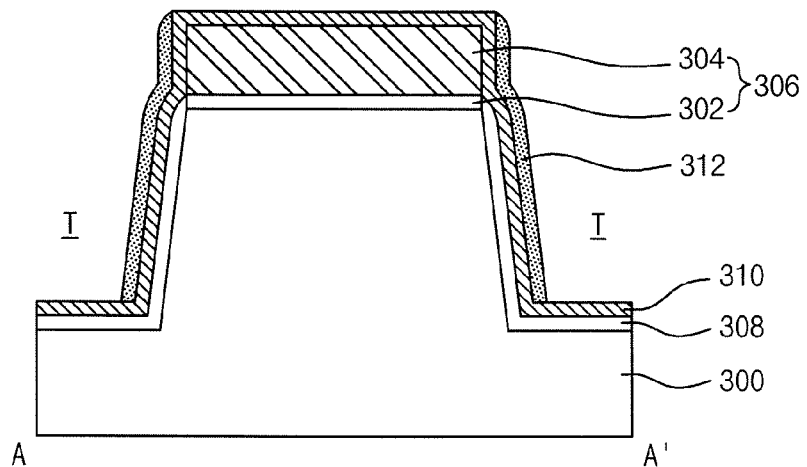
Figure 4C:
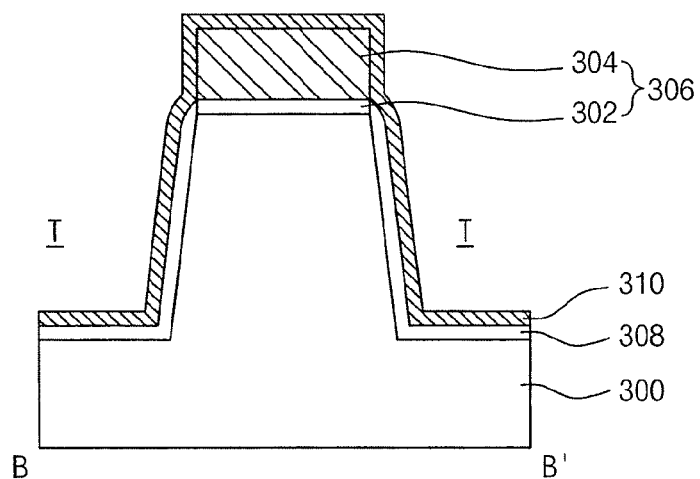

Referring to FIGS. 3C and 4C, a buffer layer 312 is formed on the resultant semiconductor substrate 300, which is formed with the liner nitride layer 310. The buffer layer 312 is formed as a layer made of any one of Si, Ge, Al, Zr, Hf, and B, preferably a Si layer. Also, the buffer layer 312 can be formed as a layer containing at least one of Si, Ge, Al, Zr, Hf, and B, that is, an oxide layer in which at least one of Si, Ge, Al, Zr, Hf, and B is oxidized to an oxygen lacking state. Portions of the buffer layer 312 formed on the bottom surfaces of the trenches T and over the active region of the semiconductor substrate 300 are removed, such that the buffer layer 312 remains only on the sidewalls of the trenches T, that is, the sidewalls of the active region in the X direction of FIG. 2.

Figure 3D:
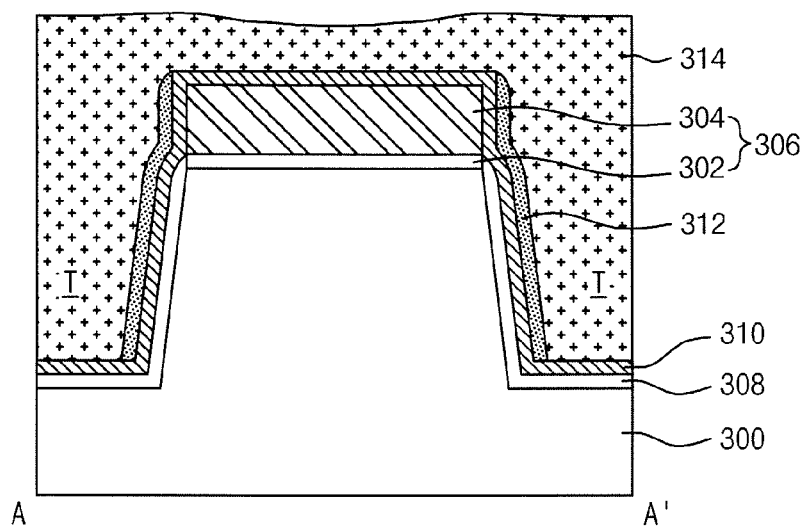
Figure 4D:
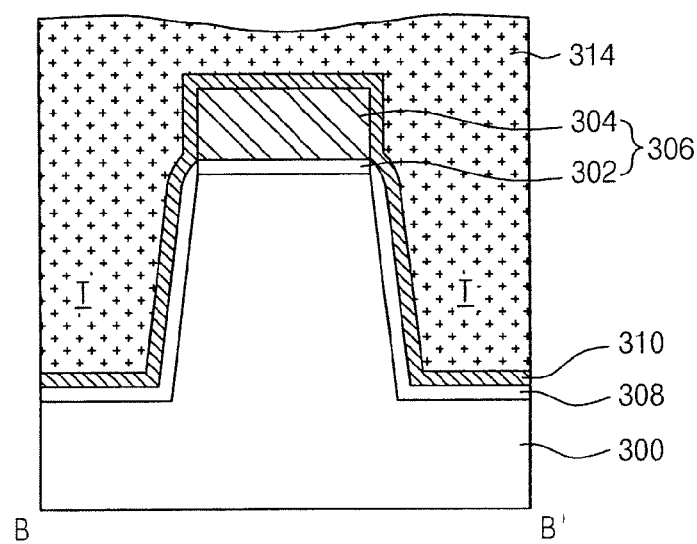

Referring to FIGS. 3D and 4D, an insulation layer 314 is formed on the resultant semiconductor substrate 300 to fill the trenches T which have the buffer layer 312 formed on the sidewalls thereof. The insulation layer 314 is formed as an oxide layer, for example, through at least one selected form group consisting of a high density plasma (HDP) process and a spin-on dielectric (SOD) process.

Figure 3E:
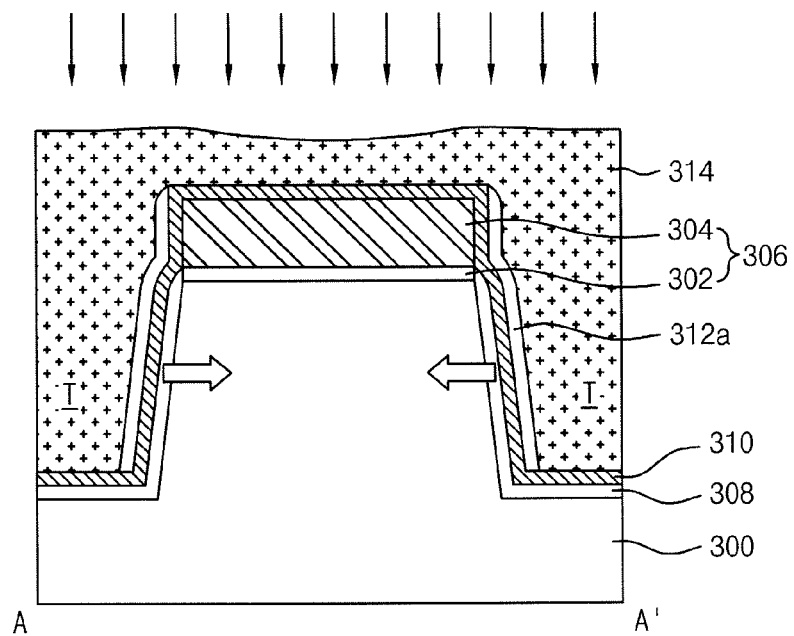
Figure 4E:
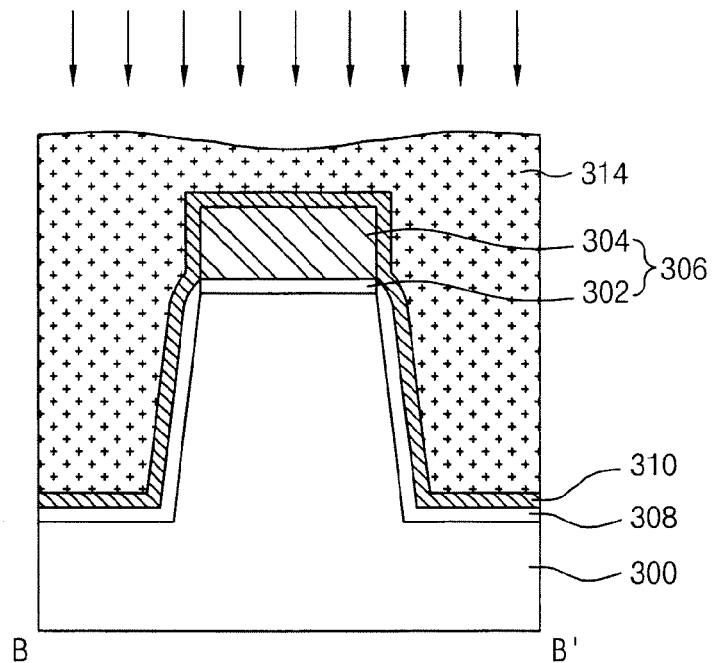

Referring to FIGS. 3E and 4E, the resultant semiconductor substrate 300, which is deposited with the insulation layer 314, is annealed, and through this annealing, the buffer layer 312 is oxidized. The reference numeral 312a designates the oxidized buffer layer. Annealing is conducted at a temperature of 700~1,000° C. under a pressure of 200~760 Torr. Through the annealing, the insulation layer 314 is baked or densified.

When the buffer layer 312 is oxidized through the annealing, the volume of the oxidized buffer layer 312a increases to substantially one and a half times the volume of the buffer layer 312. Due to the increase in the volume of the oxidized buffer layer 312a, the silicon lattices in the semiconductor substrate 300 are pushed or compressed, decreasing and the distance between the silicon lattices. As a result of the volume increase of the oxidized buffer layer 312a, compressive stress is selectively applied to the portions of the semiconductor substrate 300 on which the oxidized buffer layer 312a is formed. The compressive stress is applied to the portions of the semiconductor substrate 300, to which correspond to the channel length direction (that is, the X direction of FIG. 2) of the PMOS transistor which will be subsequently formed.

Figure 3F:
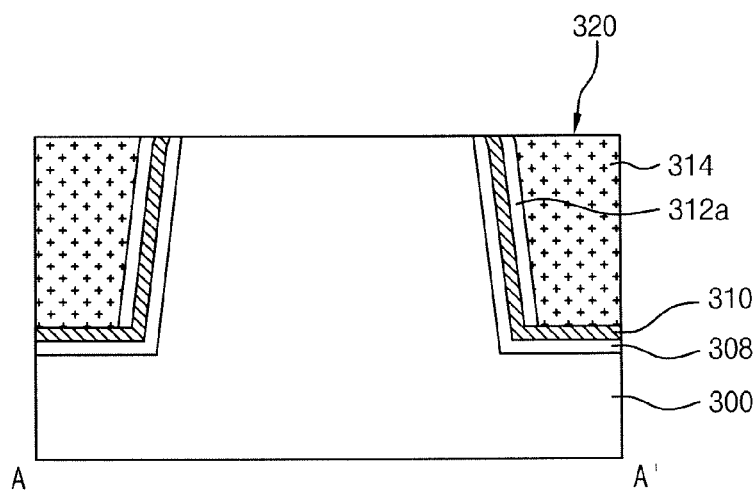
Figure 4F:
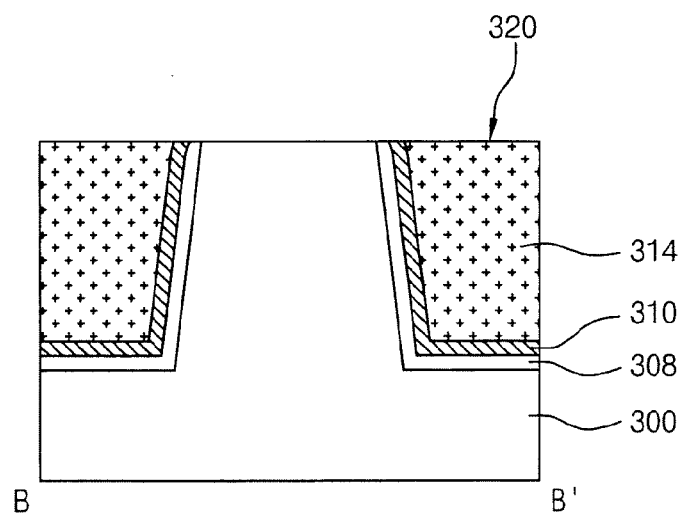

Referring to FIGS. 3F and 4F, the insulation layer 314 is removed until the hard mask 306 is exposed. The removal of the insulation layer 314 is conducted through a chemical mechanical polishing (CMP) process or an etch-back process. The exposed hard mask 306 is removed forming an isolation structure 320 for delimiting the active region in the PMOS region of the semiconductor substrate 300.

Figure 3G:
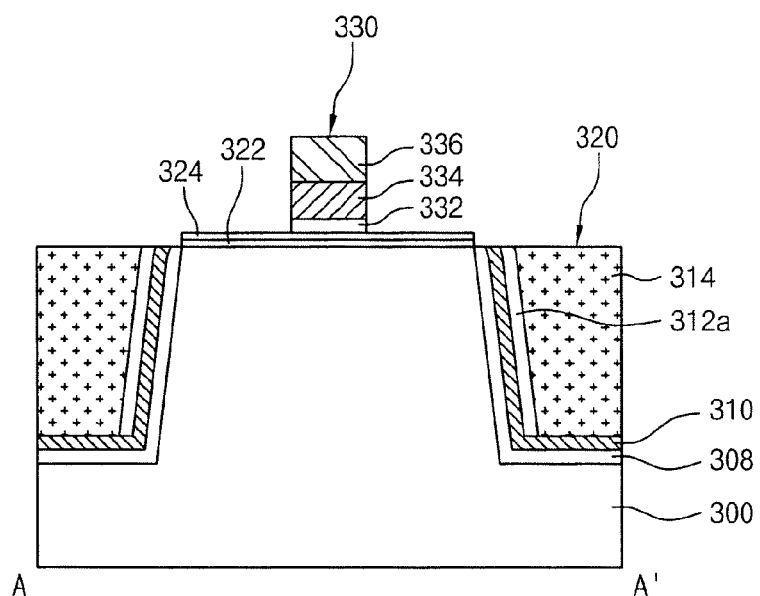
Figure 4G:
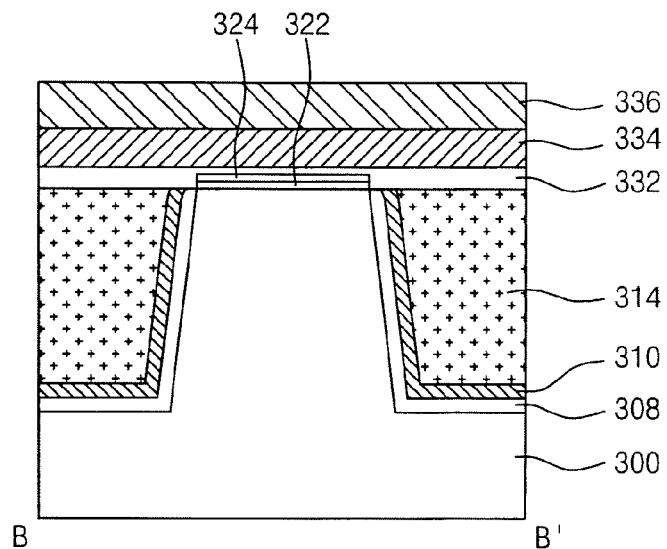

Referring to FIGS. 3G and 4G, tensile stress is applied to the active region of the PMOS region in the channel width direction (the Y direction of FIG. 2) of the PMOS transistor which will be subsequently formed. In the present invention, a method of sequentially growing a SiGe layer 322 and a Si layer 324 on the semiconductor substrate 300 through epitaxial growth is employed to apply tensile stress in the channel width direction of the PMOS transistor. In this case, the Si layer 324 is formed on the SiGe layer 322, and therefore the distance between the lattices of the Si layer 324 can be increased because the distance between lattices is greater in the SiGe layer 322 than the Si layer 324. Due to the increase in distance between the lattices of the Si layer 324, it is possible to apply tensile stress in the channel width direction of the PMOS transistor.

A gate 330 is formed on the active region of the PMOS region to which tensile stress is applied in the channel width direction. The gate 330 includes a gate insulation layer 332, a gate conductive layer 334, and a gate hard mask layer 336.

Figure 3H:
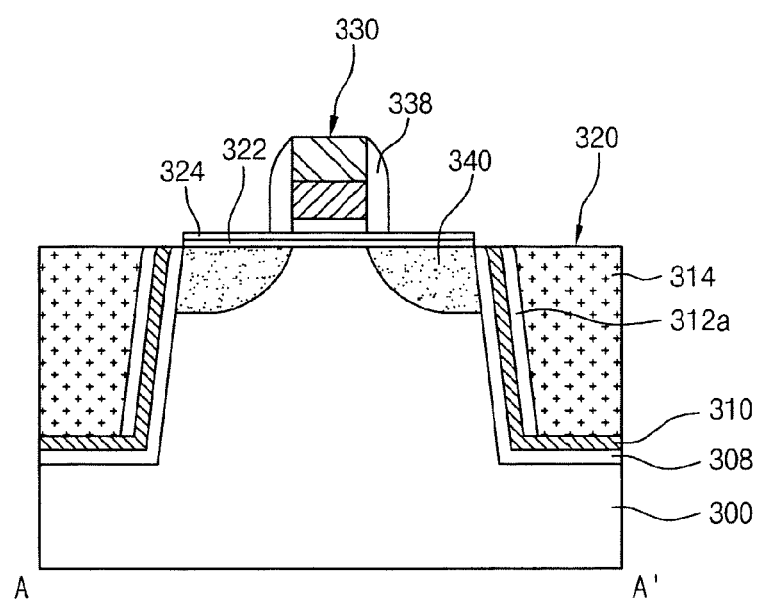
Figure 4H:
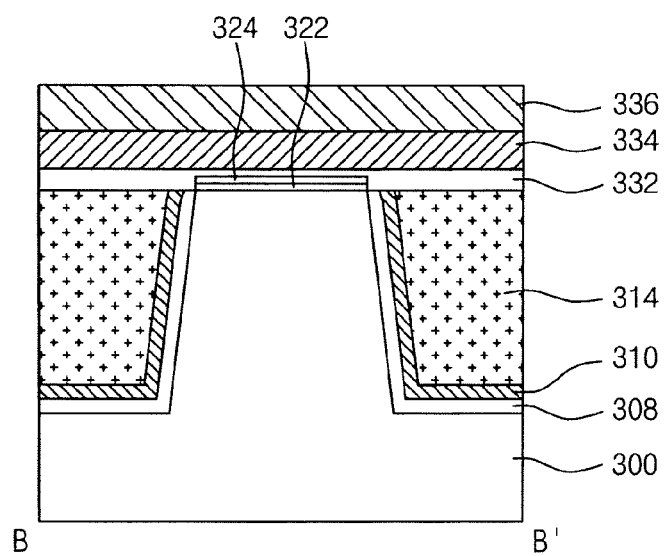

Referring to FIGS. 3H and 4H, spacers 338 are formed on the sidewalls of the gate 330, and source and drain regions 340 are formed in the semiconductor substrate 300 on both sides of the gate 330 formed with the spacers 338. A PMOS transistor is formed upon formation of the source and drain regions 340.

Thereafter, while not shown in the drawings, the manufacture of a semiconductor device according to the embodiment of the present invention is completed by sequentially conducting a series of well-known subsequent processes.

As is apparent from the above description, in the present invention, after selectively forming a buffer layer on the sidewalls of the trenches defined to form an isolation structure, by oxidizing the buffer layer, it is possible to cause compressive stress to be applied in the channel length direction of a PMOS transistor. Also, in the present invention, by sequentially forming a SiGe layer and a Si layer through epitaxial growth in an active region, it is possible to cause tensile stress to be applied in the channel width direction of the PMOS transistor.

Accordingly, in the present invention, since different types of stresses, that is, compressive stress and tensile stress, can be respectively applied in the channel length direction and the channel width direction of the PMOS transistor, the current drivability of the PMOS transistor can be effectively increased, whereby the operation speed and the operation characteristics of a semiconductor device can be improved.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the step of forming an isolation layer having a structure in which an insulation layer is filled in trenches defined in a semiconductor substrate having a PMOS region;
   the step of forming the isolation layer comprising;
   forming a buffer layer selectively on sidewalls of the trenches, wherein the buffer layer is formed as a layer made of any one of Ge, Al, Zr, Hf and B, or an oxide layer in which at least one of Si, Ge, Al, Zr, Hf, and B is oxidized to an oxygen lacking state; and
   oxidizing the buffer layer such that a distance between silicon lattices in the semiconductor substrate is decreased due to an increase in volume of the oxidized buffer layer, such that compressive stress is applied in a channel length direction of the PMOS region.

2. The method according to claim 1, wherein oxidation of the buffer layer is conducted at a temperature of about 700 to 1,000° C. and at a pressure of about 200 to 760 Torr.

3. A method for manufacturing a semiconductor device, comprising the steps of:
   defining trenches in a semiconductor substrate having a PMOS region;
   forming a buffer layer selectively on sidewalls of the trenches, wherein the buffer layer is formed as a layer made of any one of Ge, Al, Zr, Hf and B, or an oxide layer in which at least one of Si, Ge, Al, Zr, Hf, and B is oxidized to an oxygen lacking state;
   forming an insulation layer to fill the trenches having the buffer layer formed on the sidewalls thereof;
   annealing the semiconductor substrate such that the buffer layer is oxidized and a distance between silicon lattices in the semiconductor substrate is decreased due to an increase in the volume of the oxidized buffer layer, such that compressive stress is applied in a channel length direction of a PMOS transistor;
   removing portions of the insulation layer and thereby forming an isolation layer; and
   forming the PMOS transistor on the PMOS region of the semiconductor substrate.

4. The method according to claim 3, wherein, after the step of defining the trenches and before the step of forming the buffer layer, the method further comprises the steps of:
   forming a sidewall oxide on surfaces of the trenches; and
   forming a liner nitride layer on the semiconductor substrate including the sidewall oxide.

5. The method according to claim 4, wherein, after the step of forming the liner nitride layer, the method further comprises the step of:
   forming a liner oxide layer on the liner nitride layer.

6. The method according to claim 3, wherein the step of forming the buffer layer selectively on the sidewalls of the trenches comprises the steps of:

depositing a buffer layer on the semiconductor substrate including the surfaces of the trenches; and etching the buffer layer such that the buffer layer remains only on sidewalls of the trenches.

7. The method according to claim 3, wherein the insulation layer comprises an oxide layer formed through at least one selected from group consisting of a high density plasma (HDP) process and a spin-on dielectric (SOD) process.

8. The method according to claim 3, wherein annealing is conducted at a temperature of about 700 to 1,000° C. and at a pressure of about 200 to 760 Torr.

* * * * *